(12) United States Patent
An

(10) Patent No.: US 11,700,884 B2
(45) Date of Patent: Jul. 18, 2023

(54) AEROSOL GENERATION DEVICE AND HEATER FOR AEROSOL GENERATION DEVICE

(71) Applicant: KT&G CORPORATION, Daejeon (KR)

(72) Inventor: Hwi Kyeong An, Seoul (KR)

(73) Assignee: KT&G CORPORATION, Daejeon (KR)

( * ) Notice: Subject to any disclaimer, the term of this patent is extended or adjusted under 35 U.S.C. 154(b) by 227 days.

(21) Appl. No.: 16/639,020

(22) PCT Filed: Oct. 26, 2018

(86) PCT No.: PCT/KR2018/012808
§ 371 (c)(1),
(2) Date: Feb. 13, 2020

(87) PCT Pub. No.: WO2019/088587
PCT Pub. Date: May 9, 2019

(65) Prior Publication Data
US 2020/0221773 A1  Jul. 16, 2020

(30) Foreign Application Priority Data

Oct. 30, 2017  (KR) .................. 10-2017-0142578
Jun. 25, 2018  (KR) .................. 10-2018-0072935

(51) Int. Cl.
*A24F 13/00*  (2006.01)
*A24F 40/42*  (2020.01)
(Continued)

(52) U.S. Cl.
CPC ............ *A24F 40/42* (2020.01); *A24B 15/167* (2016.11); *A24D 1/20* (2020.01); *A24D 3/17* (2020.01);
(Continued)

(58) Field of Classification Search
CPC ....................................................... A24F 47/00
(Continued)

(56) References Cited

U.S. PATENT DOCUMENTS 5,348,027 A  9/1994  Barnes et al.
5,388,594 A  2/1995  Counts et al.
(Continued)

FOREIGN PATENT DOCUMENTS

CA  2 778 903 A1  5/2011
CA  2 970 045 A1  6/2016
(Continued)

OTHER PUBLICATIONS

Extended European Search Report dated Sep. 9, 2021 in European Application No. 18873562.5.
(Continued)

*Primary Examiner* — Phuong K Dinh
(74) *Attorney, Agent, or Firm* — Sughrue Mion, PLLC

(57) ABSTRACT

Provided according to an exemplary embodiment is a heater for an aerosol generation device, the heater comprising a plurality of segments combined together to form an insertion portion into which an object-to-be-heated is inserted; one or more electrically conductive tracks printed on one surface of each of the plurality of segments and disposed toward the object-to-be-heated; and an elastic member configured to surround at least a part of the plurality of segments.

16 Claims, 7 Drawing Sheets

(51) Int. Cl.

| | | |
|---|---|---|
| A24F 40/90 | (2020.01) | |
| A24F 40/46 | (2020.01) | |
| A24B 15/167 | (2020.01) | |
| A24F 40/20 | (2020.01) | |
| A24F 40/30 | (2020.01) | |
| A24D 3/17 | (2020.01) | |
| A24D 1/20 | (2020.01) | |
| A24F 40/60 | (2020.01) | |
| F21V 3/00 | (2015.01) | |
| F21V 5/00 | (2018.01) | |
| G02B 19/00 | (2006.01) | |
| H05B 3/54 | (2006.01) | |
| A24F 40/485 | (2020.01) | |
| A24F 40/10 | (2020.01) | |
| A24F 40/44 | (2020.01) | |
| A24F 40/40 | (2020.01) | |
| A24F 40/57 | (2020.01) | |
| A24F 40/65 | (2020.01) | |
| H05K 1/02 | (2006.01) | |
| H05K 1/14 | (2006.01) | |
| H05K 1/18 | (2006.01) | |
| A24F 40/50 | (2020.01) | |
| A24F 40/95 | (2020.01) | |
| A24F 15/01 | (2020.01) | |
| A24F 40/51 | (2020.01) | |
| F21Y 115/10 | (2016.01) | |

(52) U.S. Cl.
CPC .............. *A24F 15/01* (2020.01); *A24F 40/10* (2020.01); *A24F 40/20* (2020.01); *A24F 40/30* (2020.01); *A24F 40/40* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/51* (2020.01); *F21Y 2115/10* (2016.08); *H05K 2201/012* (2013.01); *H05K 2201/0154* (2013.01); *H05K 2201/10219* (2013.01)

(58) Field of Classification Search
USPC .................................................. 131/328–329
See application file for complete search history.

(56) References Cited

U.S. PATENT DOCUMENTS

| | | | |
|---|---|---|---|
| 5,408,574 | A | 4/1995 | Deevi et al. |
| 5,505,214 | A | 4/1996 | Collins et al. |
| 5,555,476 | A | 9/1996 | Suzuki et al. |
| 5,665,262 | A | 9/1997 | Hajaligol et al. |
| 5,692,525 | A | 12/1997 | Counts et al. |
| 5,723,228 | A | 3/1998 | Okamoto |
| 5,750,964 | A | 5/1998 | Counts et al. |
| 5,878,752 | A | 3/1999 | Adams et al. |
| 5,902,501 | A | 5/1999 | Nunnally et al. |
| 5,934,289 | A | 8/1999 | Watkins et al. |
| 5,949,346 | A | 9/1999 | Suzuki et al. |
| 5,970,719 | A | 10/1999 | Merritt |
| 6,026,820 | A | 2/2000 | Baggett, Jr. et al. |
| 6,615,840 | B1 | 9/2003 | Fournier et al. |
| 6,803,550 | B2 | 10/2004 | Sharpe et al. |
| 6,810,883 | B2 | 11/2004 | Felter et al. |
| 7,082,825 | B2 | 8/2006 | Aoshima et al. |
| 7,594,945 | B2 | 9/2009 | Kim et al. |
| 7,682,571 | B2 | 3/2010 | Kim et al. |
| 7,726,320 | B2 | 6/2010 | Robinson et al. |
| 8,205,622 | B2 | 6/2012 | Pan |
| 8,558,147 | B2 | 10/2013 | Greim et al. |
| 8,602,037 | B2 | 12/2013 | Inagaki |
| 8,689,804 | B2 | 4/2014 | Fernando et al. |
| 8,833,364 | B2 | 9/2014 | Buchberger |
| 8,997,754 | B2 | 4/2015 | Tucker et al. |
| 9,084,440 | B2 | 7/2015 | Zuber et al. |
| 9,165,484 | B2 | 10/2015 | Choi |
| 9,295,286 | B2 | 3/2016 | Shin |
| 9,347,644 | B2 | 5/2016 | Araki et al. |
| 9,405,148 | B2 | 8/2016 | Chang et al. |
| 9,420,829 | B2 | 8/2016 | Thorens et al. |
| 9,516,899 | B2 | 12/2016 | Plojoux et al. |
| 9,532,600 | B2 | 1/2017 | Thorens et al. |
| 9,541,820 | B2 | 1/2017 | Ogawa |
| 9,693,587 | B2 | 7/2017 | Plojoux et al. |
| 9,713,345 | B2 | 7/2017 | Farine et al. |
| 9,814,269 | B2 | 11/2017 | Li et al. |
| 9,839,238 | B2 | 12/2017 | Worm et al. |
| 9,844,234 | B2 | 12/2017 | Thorens et al. |
| 9,848,651 | B2 | 12/2017 | Wu |
| 9,854,845 | B2 | 1/2018 | Plojoux et al. |
| 9,949,507 | B2 | 4/2018 | Flick |
| 9,974,117 | B2 | 5/2018 | Qiu |
| 10,070,667 | B2 | 9/2018 | Lord et al. |
| 10,104,909 | B2 | 10/2018 | Han et al. |
| 10,104,911 | B2 | 10/2018 | Thorens et al. |
| 10,136,673 | B2 | 11/2018 | Mironov |
| 10,136,675 | B2 | 11/2018 | Li et al. |
| 10,143,232 | B2 | 12/2018 | Talon |
| 10,238,149 | B2 | 3/2019 | Hon |
| 10,390,564 | B2 | 8/2019 | Fernando et al. |
| 10,412,994 | B2 | 9/2019 | Schennum et al. |
| 10,426,193 | B2 | 10/2019 | Schennum et al. |
| 10,548,350 | B2 | 2/2020 | Greim et al. |
| 10,555,555 | B2 | 2/2020 | Fernando et al. |
| 10,602,778 | B2 | 3/2020 | Hu et al. |
| 10,617,149 | B2 | 4/2020 | Malgat et al. |
| 10,694,783 | B2 | 6/2020 | Jochnowitz |
| 10,701,973 | B2 | 7/2020 | Lee |
| 10,757,975 | B2 | 9/2020 | Batista et al. |
| 10,842,194 | B2 | 11/2020 | Batista et al. |
| 10,973,087 | B2 | 4/2021 | Wang et al. |
| 11,051,545 | B2 | 7/2021 | Batista et al. |
| 11,051,550 | B2 | 7/2021 | Lin et al. |
| 11,083,856 | B2* | 8/2021 | Buchberger .......... A61M 15/06 |
| 11,147,316 | B2 | 10/2021 | Farine et al. |
| 11,154,091 | B2* | 10/2021 | Reevell .................... A24D 1/20 |
| 2003/0226837 | A1 | 12/2003 | Blake et al. |
| 2004/0089314 | A1 | 5/2004 | Felter et al. |
| 2004/0149737 | A1 | 8/2004 | Sharpe et al. |
| 2005/0142036 | A1 | 6/2005 | Kim et al. |
| 2006/0267614 | A1 | 11/2006 | Lee et al. |
| 2007/0007266 | A1 | 1/2007 | Sasaki et al. |
| 2007/0074734 | A1 | 4/2007 | Braunshteyn et al. |
| 2007/0246382 | A1 | 10/2007 | He |
| 2007/0267031 | A1 | 11/2007 | Hon |
| 2010/0074616 | A1 | 3/2010 | Kewitsch |
| 2010/0313901 | A1 | 12/2010 | Fernando et al. |
| 2011/0226236 | A1 | 9/2011 | Buchberger |
| 2011/0234069 | A1 | 9/2011 | Chen et al. |
| 2013/0014772 | A1 | 1/2013 | Liu |
| 2013/0220466 | A1 | 8/2013 | Zandiyeh et al. |
| 2013/0228191 | A1 | 9/2013 | Newton |
| 2013/0255675 | A1 | 10/2013 | Liu |
| 2014/0060554 | A1 | 3/2014 | Collett et al. |
| 2014/0069424 | A1 | 3/2014 | Poston et al. |
| 2014/0209105 | A1 | 7/2014 | Sears et al. |
| 2014/0217085 | A1 | 8/2014 | Alima |
| 2014/0261487 | A1 | 9/2014 | Chapman et al. |
| 2014/0286630 | A1 | 9/2014 | Buchberger |
| 2014/0339509 | A1 | 11/2014 | Choi et al. |
| 2014/0345633 | A1 | 11/2014 | Talon et al. |
| 2014/0353856 | A1 | 12/2014 | Dubief |
| 2015/0020831 | A1 | 1/2015 | Weigensberg et al. |
| 2015/0163859 | A1 | 6/2015 | Schneider et al. |

(56) References Cited

U.S. PATENT DOCUMENTS

| | | |
|---|---|---|
| 2015/0223520 A1 | 8/2015 | Phillips et al. |
| 2015/0230521 A1 | 8/2015 | Talon |
| 2015/0282527 A1 | 10/2015 | Henry, Jr. |
| 2015/0327596 A1 | 11/2015 | Alarcon et al. |
| 2016/0103364 A1 | 4/2016 | Nam et al. |
| 2016/0128386 A1 | 5/2016 | Chen |
| 2016/0174613 A1 | 6/2016 | Zuber et al. |
| 2016/0205998 A1 | 7/2016 | Matsumoto et al. |
| 2016/0321879 A1 | 11/2016 | Oh et al. |
| 2016/0324216 A1 | 11/2016 | Li et al. |
| 2016/0331030 A1 | 11/2016 | Ampolini et al. |
| 2016/0345625 A1 | 12/2016 | Liu |
| 2017/0020195 A1 | 1/2017 | Cameron |
| 2017/0042227 A1 | 2/2017 | Gavrielov et al. |
| 2017/0049155 A1 | 2/2017 | Liu |
| 2017/0055589 A1 | 3/2017 | Fernando et al. |
| 2017/0119051 A1 | 5/2017 | Blandino et al. |
| 2017/0119053 A1 | 5/2017 | Henry, Jr. et al. |
| 2017/0143041 A1 | 5/2017 | Batista et al. |
| 2017/0188634 A1 | 7/2017 | Plojoux et al. |
| 2017/0197043 A1 | 7/2017 | Buchberger |
| 2017/0197046 A1 | 7/2017 | Buchberger |
| 2017/0214261 A1 | 7/2017 | Gratton |
| 2017/0238609 A1 | 8/2017 | Schlipf |
| 2017/0295844 A1 | 10/2017 | Thevenaz et al. |
| 2017/0303598 A1 | 10/2017 | Li et al. |
| 2017/0325505 A1 | 11/2017 | Force et al. |
| 2017/0347715 A1 | 12/2017 | Mironov et al. |
| 2018/0027878 A1 | 2/2018 | Dendy et al. |
| 2018/0028993 A1 | 2/2018 | Dubief |
| 2018/0160733 A1 | 6/2018 | Leadley et al. |
| 2018/0199630 A1 | 7/2018 | Qiu |
| 2019/0059448 A1 | 2/2019 | Talon |
| 2019/0159524 A1 | 5/2019 | Qiu |
| 2019/0281896 A1 | 9/2019 | Chapman et al. |
| 2020/0093177 A1 | 3/2020 | Han et al. |
| 2020/0093185 A1 | 3/2020 | Lim |
| 2020/0094997 A1 | 3/2020 | Menon et al. |
| 2020/0154765 A1 | 5/2020 | Lee et al. |
| 2020/0196670 A1 | 6/2020 | Alarcon et al. |
| 2020/0260790 A1 | 8/2020 | Kaufman et al. |
| 2020/0261000 A1 | 8/2020 | Kim et al. |
| 2020/0305240 A1 | 9/2020 | Holoubek et al. |
| 2020/0329772 A1 | 10/2020 | Kim et al. |
| 2020/0359681 A1 | 11/2020 | Han et al. |
| 2020/0404969 A1 | 12/2020 | Zuber et al. |
| 2021/0146067 A1 | 5/2021 | Buchberger |

FOREIGN PATENT DOCUMENTS

| | | |
|---|---|---|
| CN | 1078621 A | 11/1993 |
| CN | 1126425 A | 7/1996 |
| CN | 1190335 A | 8/1998 |
| CN | 1280661 A | 1/2001 |
| CN | 1491598 A | 4/2004 |
| CN | 1633247 A | 6/2005 |
| CN | 1871987 A | 12/2006 |
| CN | 101277622 A | 10/2008 |
| CN | 101301963 A | 11/2008 |
| CN | 101324490 A | 12/2008 |
| CN | 201253138 Y | 6/2009 |
| CN | 101518361 A | 9/2009 |
| CN | 201314692 Y | 9/2009 |
| CN | 101557728 A | 10/2009 |
| CN | 101637308 A | 2/2010 |
| CN | 201657047 U | 11/2010 |
| CN | 201996322 U | 10/2011 |
| CN | 102264251 A | 11/2011 |
| CN | 102595943 A | 7/2012 |
| CN | 202385727 U | 8/2012 |
| CN | 102665459 A | 9/2012 |
| CN | 202854031 U | 4/2013 |
| CN | 103099319 A | 5/2013 |
| CN | 202907797 U | 5/2013 |
| CN | 203040065 U | 7/2013 |
| CN | 103271447 A | 9/2013 |
| CN | 103477252 A | 12/2013 |
| CN | 103519351 A | 1/2014 |
| CN | 103653257 A | 3/2014 |
| CN | 103653258 A | 3/2014 |
| CN | 203492793 U | 3/2014 |
| CN | 103720056 A | 4/2014 |
| CN | 103889258 A | 6/2014 |
| CN | 103974635 A | 8/2014 |
| CN | 103974638 A | 8/2014 |
| CN | 103974640 A | 8/2014 |
| CN | 103997922 A | 8/2014 |
| CN | 104146353 A | 11/2014 |
| CN | 104188110 A | 12/2014 |
| CN | 104219973 A | 12/2014 |
| CN | 204120226 U | 1/2015 |
| CN | 20413240 U | 2/2015 |
| CN | 204146340 U | 2/2015 |
| CN | 104423130 A | 3/2015 |
| CN | 204317492 U | 5/2015 |
| CN | 204393344 U | 6/2015 |
| CN | 204483007 U | 7/2015 |
| CN | 104886776 A | 9/2015 |
| CN | 105188430 A | 12/2015 |
| CN | 204838003 U | 12/2015 |
| CN | 105326092 A | 2/2016 |
| CN | 205072064 U | 3/2016 |
| CN | 205180371 U | 4/2016 |
| CN | 205214209 U | 5/2016 |
| CN | 105722416 A | 6/2016 |
| CN | 205358225 U | 7/2016 |
| CN | 105852221 A | 8/2016 |
| CN | 105852225 A | 8/2016 |
| CN | 205456064 U | 8/2016 |
| CN | 105919162 A | 9/2016 |
| CN | 205624474 U | 10/2016 |
| CN | 106136331 A | 11/2016 |
| CN | 106163304 A | 11/2016 |
| CN | 106170215 A | 11/2016 |
| CN | 205671480 U | 11/2016 |
| CN | 106231934 A | 12/2016 |
| CN | 106235419 A | 12/2016 |
| CN | 205831079 U | 12/2016 |
| CN | 106418729 A | 2/2017 |
| CN | 10535680 A | 3/2017 |
| CN | 106473232 A | 3/2017 |
| CN | 106473233 A | 3/2017 |
| CN | 106490686 A | 3/2017 |
| CN | 106690427 A | 5/2017 |
| CN | 106723379 A | 5/2017 |
| CN | 106793834 A | 5/2017 |
| CN | 206197012 U | 5/2017 |
| CN | 106912985 A | 7/2017 |
| CN | 206314585 U | 7/2017 |
| CN | 106998816 A | 8/2017 |
| CN | 107105772 A | 8/2017 |
| CN | 206442590 U | 8/2017 |
| CN | 206443202 U | 8/2017 |
| CN | 206443214 U | 8/2017 |
| CN | 107173850 A | 9/2017 |
| CN | 107183789 A | 9/2017 |
| CN | 206462413 U | 9/2017 |
| CN | 107249366 A | 10/2017 |
| CN | 107278125 A | 10/2017 |
| CN | 206547882 U | 10/2017 |
| CN | 107801375 A | 3/2018 |
| CN | 108013512 A | 5/2018 |
| CN | 110325058 A | 10/2019 |
| CN | 110958841 A | 4/2020 |
| EA | 201290392 A1 | 10/2012 |
| EA | 201290240 A1 | 12/2012 |
| EA | 026076 B1 | 2/2017 |
| EP | 0 438 862 A2 | 7/1991 |
| EP | 0 917 831 A1 | 5/1999 |
| EP | 0 822 760 B1 | 6/2003 |
| EP | 1 947 965 A2 | 7/2008 |
| EP | 2 201 850 A1 | 6/2010 |
| EP | 2 316 286 A1 | 5/2011 |
| EP | 2 327 318 A1 | 6/2011 |

(56) References Cited

FOREIGN PATENT DOCUMENTS

| | | |
|---|---|---|
| EP | 2 340 729 A1 | 7/2011 |
| EP | 2368449 A1 | 9/2011 |
| EP | 2 677 273 A1 | 12/2013 |
| EP | 2 921 065 A1 | 9/2015 |
| EP | 3 104 721 | 12/2016 |
| EP | 3 257 386 B1 | 6/2019 |
| EP | 3 248 486 B1 | 8/2019 |
| EP | 3 569 076 A1 | 11/2019 |
| EP | 3 248 485 B1 | 4/2020 |
| EP | 3 656 229 A2 | 5/2020 |
| GB | 2 301 894 A | 12/1996 |
| GB | 2514893 A | 12/2014 |
| JP | S48-63677 U | 8/1973 |
| JP | 62-15793 A | 1/1987 |
| JP | S63-68690 U | 5/1988 |
| JP | 6-73784 U | 10/1994 |
| JP | 7-72809 A | 3/1995 |
| JP | 7-184627 A | 7/1995 |
| JP | H08-122942 A | 5/1996 |
| JP | 9-75058 A | 3/1997 |
| JP | 9-161822 A | 6/1997 |
| JP | 9-228919 A | 9/1997 |
| JP | 10-37781 A | 2/1998 |
| JP | 2001200495 A | 7/2001 |
| JP | 2002-514910 A | 5/2002 |
| JP | 2003-527127 A | 9/2003 |
| JP | 2004-212102 A | 7/2004 |
| JP | 2005-199913 A | 7/2005 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2012-513750 A | 6/2012 |
| JP | 2013-509160 A | 3/2013 |
| JP | 2013-524835 A | 6/2013 |
| JP | 2014132560 A | 7/2014 |
| JP | 2014-216287 A | 11/2014 |
| JP | 2014-533513 A | 12/2014 |
| JP | 2015-13192 A | 1/2015 |
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-506901 A | 3/2017 |
| JP | 2017-510270 A | 4/2017 |
| JP | 2017-511123 A | 4/2017 |
| JP | 2017-127300 A | 7/2017 |
| JP | 2017-522876 A | 8/2017 |
| KR | 1999-0081973 A | 11/1999 |
| KR | 20-0203233 Y1 | 11/2000 |
| KR | 10-0304044 B1 | 11/2001 |
| KR | 10-0393327 B1 | 10/2003 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 20140044165 A | 4/2014 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-2017-0057535 | 5/2017 |
| KR | 10-1733448 B1 | 5/2017 |
| KR | 10-2017-0067171 A | 6/2017 |
| KR | 10-2017-0083596 A | 7/2017 |
| KR | 10-2017-0117444 A | 10/2017 |
| KR | 10-2017-0118233 A | 10/2017 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |
| WO | 2011/015826 A1 | 2/2011 |
| WO | 2011/050964 A1 | 5/2011 |
| WO | 2011/063970 A1 | 6/2011 |
| WO | 2013/102609 A2 | 7/2013 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/117702 A1 | 8/2015 |
| WO | 2015-168828 A1 | 11/2015 |
| WO | 2015/174657 A1 | 11/2015 |
| WO | 2015/177046 A1 | 11/2015 |
| WO | 2015/189388 A1 | 12/2015 |
| WO | 2016/005601 A1 | 1/2016 |
| WO | 2016/009202 A1 | 1/2016 |
| WO | 2016/012795 A1 | 1/2016 |
| WO | 2016/091658 A1 | 6/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/199065 A1 | 12/2016 |
| WO | 2016/199066 A1 | 12/2016 |
| WO | 2016/207407 A1 | 12/2016 |
| WO | 2017/001520 A1 | 1/2017 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |

(56) References Cited

FOREIGN PATENT DOCUMENTS

| WO | 2017/133056 A1 | 8/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Office Action dated Aug. 3, 2021 in Japanese Application No. 2020-503856.
Extended European Search Report dated Aug. 18, 2021 in European Application No. 18874344.7.
Extended European Search Report dated Jul. 30, 2021 in European Application No. 18874446.0.
Extended European Search Report dated Aug. 17, 2021 in European Application No. 18872432.2.
Office Action dated Aug. 17, 2021 in Japanese Application No. 2020-503962.
Extended European Search Report dated Aug. 10, 2021 in European Application No. 18873846.2.
Extended European Search Report dated Aug. 17, 2021 in European Application No. 18873943.7.
Extended European Search Report dated Aug. 10, 2021 in European Application No. 18874742.2.
Extended European Search Report dated Aug. 12, 2021 in European Application No. 18874837.0.
Extended European Search Report dated Aug. 20, 2021 in European Application No. 18874962.6.
Extended European Search Report dated Aug. 6, 2021 in European Application No. 18872527.9.
Extended European Search Report dated Sep. 2, 2021 in European Application No. 18874839.6.
Extended European Search Report dated Jul. 20, 2021 in European Application No. 18872006.4.
Office Action dated Sep. 3, 2021 in Chinese Application No. 201880035480.1.
Office Action dated Aug. 11, 2021 in Chinese Application No. 201880029050.9.
Office Action dated Apr. 5, 2019 in Korean Application No. 10-2019-0017393.
Office Action dated Apr. 25, 2019 in Korean Application No. 10-2019-0033722.
Office Action dated Apr. 25, 2019 in Korean Application No. 10-2019-0033723.
Office Action dated Jun. 7, 2021 in Canadian Application No. 3,076,886.
Office Action dated Feb. 9, 2018 in Korean Application No. 10-2017-0058786.
Communication dated Jul. 27, 2020 by the Russian Patent Office in application No. 2020110821.
Communication dated Jun. 11, 2020 by the Korean Patent Office in application No. 10-2018-0051469.
Extended European Search Report dated Jan. 15, 2021 in European Application No. 18799246.6.
Office Action dated May 25, 2020 in Russian Application No. 2019135871.
Office Action dated Jun. 10, 2020 in Korean Application No. 10-2018-0052137.
Office Action dated Oct. 5, 2020 in Korean Application No. 10-2020-0090577.
Office Action dated Oct. 16, 2020 in Korean Application No. 10-2020-0092553.
Extended European Search Report dated Nov. 16, 2020 in European Application No. 20189002.7.
Office Action dated Dec. 8, 2020 in Russian Application No. 2020113632.
Office Action dated Nov. 25, 2020 in Russian Application No. 2020124810.
Office Action dated Jan. 26, 2021 in Japanese Application No. 2020-502671.
Office Action dated Dec. 22, 2020 in Japanese Application No. 2020-502181.
Office Action dated Dec. 22, 2020 in Japanese Application No. 2020-503856.
Extended European Search Report dated Nov. 13, 2020 in European Application No. 20188970.6.
Office Action dated Nov. 10, 2020 in Japanese Application No. 2020-523671.
Office Action dated Nov. 24, 2020 in Russian Application No. 2020124811.
Extended European Search Report dated Oct. 15, 2021 in European Application No. 18872138.5.
Communication dated Dec. 3, 2021 from the Chinese Patent Office in Chinese Application No. 201880049465.2.
Communication dated Dec. 2, 2021 from the Chinese Patent Office in Chinese Application No. 201880048657.1.
Communication dated Dec. 2, 2021 from the Chinese Patent Office in Chinese Application No. 201880048444.9.
Office Action dated Aug. 12, 2019 in Korean Application No. 10-2019-0033722.
Office Action dated Jul. 2, 2019 in Korean Application No. 10-2019-0017392.
Office Action dated Jul. 3, 2019 in Korean Application No. 10-2019-0016835.
Office Action dated May 18, 2019 in Korean Application No. 10-2018-0090063.
Office Action dated Oct. 25, 2019 in Korean Application No. 10-2018-0078296.
Office Action dated Oct. 15, 2019 in Korean Application No. 10-2018-0074188.
Office Action dated Oct. 8, 2019 in Korean Application No. 10-2018-0072992.
Office Action dated Oct. 8, 2019 in Korean Application No. 10-2018-0072935.
Office Action dated Sep. 6, 2019 in Korean Application No. 10-2018-0069645.
Office Action dated Jul. 10, 2019 in Korean Application No. 10-2018-0064487.
Office Action dated Jun. 24, 2019 in Korean Application No. 10-2018-0062137.
Office Action dated Jun. 19, 2019 in Korean Application No. 10-2018-0059580.
Office Action dated May 13, 2019 in Korean Application No. 10-2018-0058596.
Office Action dated May 3, 2019 in Korean Application No. 10-2018-0055120.
Office Action dated Dec. 9, 2019 in Korean Application No. 10-2018-0052133.
Office Action dated Dec. 9, 2019 in Korean Application No. 10-2018-0051469.
Office Action dated Dec. 9, 2019 in Korean Application No. 10-2018-0051467.
International Search Report dated Apr. 16, 2019 in International Application No. PCT/KR2018/012899.
International Search Report dated Apr. 26, 2019 in International Application No. PCT/KR2018/012895.
International Search Report dated May 17, 2019 in International Application No. PCT/KR2018/012810.
International Search Report dated May 17, 2019 in International Application No. PCT/KR2018/012809.
International Search Report dated May 17, 2019 in International Application No. PCT/KR2018/012808.
International Search Report dated May 3, 2019 in International Application No. PCT/KR2018/012807.
International Search Report dated May 17, 2019 in International Application No. PCT/KR2018/012776.
International Search Report dated Apr. 3, 2019 in International Application No. PCT/KR2018/012775.

(56) References Cited

OTHER PUBLICATIONS

International Search Report dated Apr. 3, 2019 in International Application No. PCT/KR2018/012774.
International Search Report dated Apr. 3, 2019 in International Application No. PCT/KR2018/012773.
International Search Report dated May 20, 2019 in International Application No. PCT/KR2018/012685.
International Search Report dated May 21, 2019 in International Application No. PCT/KR2018/012676.
International Search Report dated Nov. 26, 2018 in International Application No. PCT/KR2018/005767.
International Search Report dated Aug. 28, 2018 in International Application No. PCT/KR2018/005693.
International Search Report dated Nov. 2, 2018 in International Application No. PCT/KR2018/005306.
Communication dated Feb. 24, 2021 by the Japanese Patent Office in application No. 2020-503962.
Communication dated Mar. 23, 2021 by the Japanese Patent Office in application No. 2020-522897.
Communication dated Mar. 2, 2021 by the Japanese Patent Office in application No. 2020-523669.
Communication dated Mar. 30, 2021 by the Japanese Patent Office in application No. 2020-501446.
Communication dated Mar. 16, 2021 by the Japanese Patent Office in application No. 2020-521441.
Communication dated Feb. 9, 2021 by the Japanese Patent Office in application No. 2020-501205.
Communication dated Mar. 16, 2021 by the European Patent Office in application No. 18806877.9.
Office Action dated Jan. 24, 2022 in Chinese Application No. 201880030661.5.
Office Action dated Dec. 24, 2021 in Chinese Application No. 201880055847.6.
Office Action dated Dec. 20, 2021 in Chinese Application No. 201880048655.2.
Office Action dated Jan. 4, 2022 in Chinese Application No. 201880048703.8.
Office Action dated Jan. 18, 2022 in Chinese Application No. 201880052857.4.
Office Action dated Jan. 30, 2022 in Chinese Application No. 201880052855.5.
"PCB Design and Processing", Seping, pp. 32-35, Beijing Institute of Technology Publishing House, Feb. 2017, Feb. 28, 2017 (6 pages total).
Office Action dated Dec. 31, 2021 in Chinese Application No. 201880049189.X.
Communication dated Feb. 28, 2022 from the Chinese Patent Office in Chinese Application No. 201880063459.2.
Communication dated Mar. 29, 2022 from the Japanese Patent Office in Japanese Application No. 2020-522897.
Communication dated Mar. 3, 2022 from the Chinese Patent Office in Chinese Application No. 201880058682.8.
Wenxue Geng et al., "Technology Manual of a Programmable Controller", Science Technology, 1st Edition, 1996, p. 132 (2 pages total).
Office Action dated Aug. 26, 2022 issued by the Chinese Patent Office in Chinese Application No. 201880048703.8.
Office Action dated Jul. 12, 2022 issued by the Chinese Patent Office in Chinese Application No. 201880049189.X.
Office Action dated Jul. 4, 2022 issued by the Chinese Patent Office in Chinese Application No. 201880048657.1.
Office Action dated Jun. 22, 2022 issued by the Chinese Patent Office in Chinese Application No. 201880048444.9.
Office Action dated Jun. 28, 2022 issued by the Japanese Patent Office in Japanese Application No. 2020-522897.
Su Zuen et al., "Heat Transfer", Dalian Maritime University Press, 1989, pp. 12-13, (9 pages total).
Notice of Reasons for Refusal issued in the Japanese Patent Office dated Nov. 1, 2022 in corresponding Japanese Patent Application No. 2020-501205.
Decision of Rejection issued in the China National Intellectual Property Administration dated Dec. 29, 2022 in corresponding Chinese Patent Application No. 201880055847.6.
Notice of Reasons for Refusal issued in the Japanese Patent Office dated Dec. 20, 2022 in corresponding Japanese Patent Application No. 2021-122551.
First Office Action dated Jan. 20, 2023, issued in the Chinese Patent Office in corresponding Chinese Patent Application No. 202010761215.0.
Notice of Reasons for Refusal dated Jan. 10, 2023 in the Japanese Patent Office in corresponding Japanese Patent Application No. 2021-080578
Notice of Reasons for Refusal issued in the Japanese Patent Office dated Feb. 14, 2023 in coresgonding Jaganese Patent Agglication No. 2022-074915.
First Office Action issued in the China National Intellectual Property Administration dated Jan. 28, 2023 in corresponding Chinese Patent Anglication No. 202010761219.9.
First Office Action issued in the China National Intellectual Property Administration dated Mar. 30, 2023 in corresponding Chinese Patent Application No. 201880030661.5.
Jia Wei-Ping, et al., "Determination of Aerosol Concentration in Mainstream Cigarette Smoke Based on Online Impact", Tobacco Science & Technology, Manufacturing Technology, 1994-2022 China Academic Journal Electronic Publishing House.
The third Office Action issued in the China National Intellectual Property dated May 12, 2023 in corresponding Chinese Patent Application No. 201880048703.8.

* cited by examiner a < b

AEROSOL GENERATION DEVICE AND HEATER FOR AEROSOL GENERATION DEVICE

TECHNICAL FIELD

The present disclosure relates to an aerosol generation device and a heater for the aerosol generation device, and more particularly, to an aerosol generation device capable of generating an aerosol having various flavors by passing the aerosol generated by a vaporizer through a cigarette.

BACKGROUND ART

Recently, the demand for alternative methods to overcome the shortcomings of general cigarettes has increased. For example, there is an increasing demand for a method of generating aerosol by heating an aerosol generating material in cigarettes, rather than by burning cigarettes. Accordingly, studies on a heating-type cigarette and a heating-type aerosol generating device have been actively conducted.

An aerosol generation device according to the related art includes an internal insertion-type heater inserted into a cigarette, but there is a problem in that when the internal insertion-type heater is inserted into the cigarette, foreign substances are discharged from the cigarette as one end of the cigarette penetrates. In order to solve such a problem, a cylindrical heater for heating the cigarette from the outside has been developed, but in the case of a cylindrical heater, there is a problem in that heat transfer to the cigarette is reduced as compared to the internal insertion-type heater directly inserted into the cigarette. Therefore, there may be a need for a technique for maximizing the efficiency of heat transfer to cigarettes in an aerosol generation device including a cylindrical heater.

DESCRIPTION OF EXEMPLARY EMBODIMENTS

Solution to Problem

Provided are an aerosol generation device and a heater for the aerosol generation device. The technical solution of the present disclosure is not limited to the above-described technical problems, and other technical problems may be deduced from the following exemplary embodiments. For example, a heater for an aerosol generation device may include a plurality of segments coupled to each other to form an insertion portion into which an object-to-be-heated is inserted; one or more electrically conductive tracks printed on one surface of each of the plurality of segments and disposed toward the object-to-be-heated; and an elastic member configured to surround at least some of the plurality of segments.

Advantageous Effects of Disclosure

The present disclosure may provide a heater for an aerosol generation device. Specifically, the heater for the aerosol generation device according to the present disclosure may include a plurality of segments combined together to form an insertion portion into which an object-to-be-heated (e.g., a cigarette) is inserted; one or more electrically conductive tracks printed on one surface of each of the plurality of segments and disposed toward the object-to-be-heated, and an elastic member that surrounds and compresses at least a part of the plurality of segments to maintain a structure in which the plurality of segments are coupled.

A cylindrical heater included in an aerosol generation device according to the related art has a problem that it is difficult to directly print the electrically conductive track on the inner surface of a member having a cylindrical structure. On the contrary, according to the structure of the heater for the aerosol generation device according to the present disclosure, the electrically conductive track may be easily printed on the inner surface of each of the plurality of segments having a shape in which a member of a cylindrical structure is cut into a plurality of members, and then the plurality of segments may be coupled to each other to form the cylindrical structure. Because the electrically conductive track may be printed on the inner surface of the heater and in direct contact with the cigarette, the heat transfer efficiency with respect to the cigarette may increase.

In addition, the heater for the aerosol generation device according to the present disclosure includes the elastic member that applies elastic force to the plurality of segments such that the cigarette inserted into the insertion portion formed by coupling the plurality of segments with each other and the electrically conductive track printed on one surface of each of the plurality of segments may be in close contact with each other. Because the electrically conductive track and the cigarette are in close contact with each other, the heat transfer efficiency with respect to the cigarette may further increase.

BEST MODE

Figure 1:
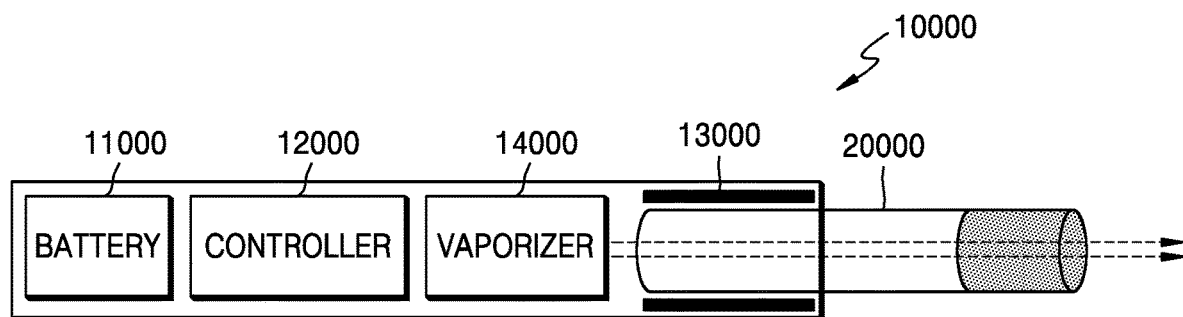
FIGS. 1 and 2 are diagrams showing examples in which a cigarette is inserted into an aerosol generating device.

According to an aspect of the present disclosure, a heater for an aerosol generation device may include a plurality of segments combined together to form an insertion portion into which an object-to-be-heated is inserted; one or more electrically conductive tracks printed on one surface of each of the plurality of segments and disposed toward the object-to-be-heated; and an elastic member configured to surround at least a part of the plurality of segments.

The elastic member may be configured to surround and compress the part of the plurality of segments to maintain a structure in which the plurality of segments are combined.

The elastic member may include a material having an elastic force in a direction of an inner surface of the elastic member.

For example, an inner diameter of the elastic member may be smaller than an outer diameter of a structure in which the plurality of segments is in close contact with each other along an outer circumference of the object-to-be-heated.

At least some of the plurality of segments may be spaced apart from each other by the object-to-be-heated inserted into the insertion portion.

A cross-sectional shape of the elastic member configured to surround the part of the plurality of segments viewed in a direction in which the object-to-be-heated is inserted may be at least one of a circle and a polygon.

The heater may further include a lower support portion disposed at a lower end of the plurality of segments to support the plurality of segments at a lower end thereof; and an upper support portion configured to support the plurality of segments at an upper end thereof, and including one or more wing portions bound to the lower support portion.

An inner surface of at least one of the lower support portion, the elastic member and the upper support portion may include at least one portion spaced apart from an outer surface of the plurality of segments.

An inner surface of at least one of the lower support portion, the elastic member and the upper support portion may be in contact with an outer surface of the plurality of segments by using a line contact method or a point contact method.

Meanwhile, the object-to-be-heated is a cigarette, and the one or more electrically conductive tracks may be printed on a position corresponding to a tobacco rod of the cigarette inserted into the insertion portion.

The plurality of segments may be heated to different temperatures by the one or more electrically conductive tracks.

The heater may further include a coating layer formed on an inner surface of each of the plurality of segments to protect the one or more electrically conductive tracks.

The heater may further include one or more sensor tracks printed on an inner surface of each of the plurality of segments.

A temperature of each of the plurality of segments may be independently detectable by the one or more sensor tracks.

According to another aspect of the present disclosure, an aerosol generation device may include a heater including a plurality of segments combined together to form an insertion portion into which an object-to-be-heated is inserted; one or more electrically conductive tracks printed on one surface of each of the plurality of segments and disposed toward the object-to-be-heated; and an elastic member configured to surround at least a part of the plurality of segments; and a controller configured to heat the plurality of segments to different temperatures by controlling power supply to the one or more electrically conductive tracks.

According to another aspect of the present disclosure, a method of manufacturing a heater for an aerosol generation device may include printing one or more electrically conductive tracks on one surface of each of a plurality of segments; placing the plurality of segments such that the printed one or more electrically conductive tracks face each other and installing a lower support portion at a lower end of the plurality of segments to support the plurality of segments; surrounding at least some of the plurality of segments with an elastic member; and installing an upper support portion at an upper end of the plurality of segments, the upper support portion including one or more wing portions bound to the lower support portion.

MODE OF DISCLOSURE

With respect to the terms in the various exemplary embodiments, the general terms which are currently and widely used are selected in consideration of functions of structural elements in the various exemplary embodiments of the present disclosure. However, meanings of the terms can be changed according to intention, a judicial precedence, the appearance of a new technology, and the like. In addition, in certain cases, a term which is not commonly used can be selected. In such a case, the meaning of the term will be described in detail at the corresponding portion in the description of the present disclosure. Therefore, the terms used in the various exemplary embodiments of the present disclosure should be defined based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

Hereinafter, the present disclosure will now be described more fully with reference to the accompanying drawings, in which exemplary embodiments of the present disclosure are shown such that one of ordinary skill in the art may easily work the present disclosure. The disclosure can, however, be embodied in many different forms and should not be construed as being limited to the exemplary embodiments set forth herein.

Hereinafter, exemplary embodiments of the present disclosure will be described in detail with reference to the drawings.

Figure 2:
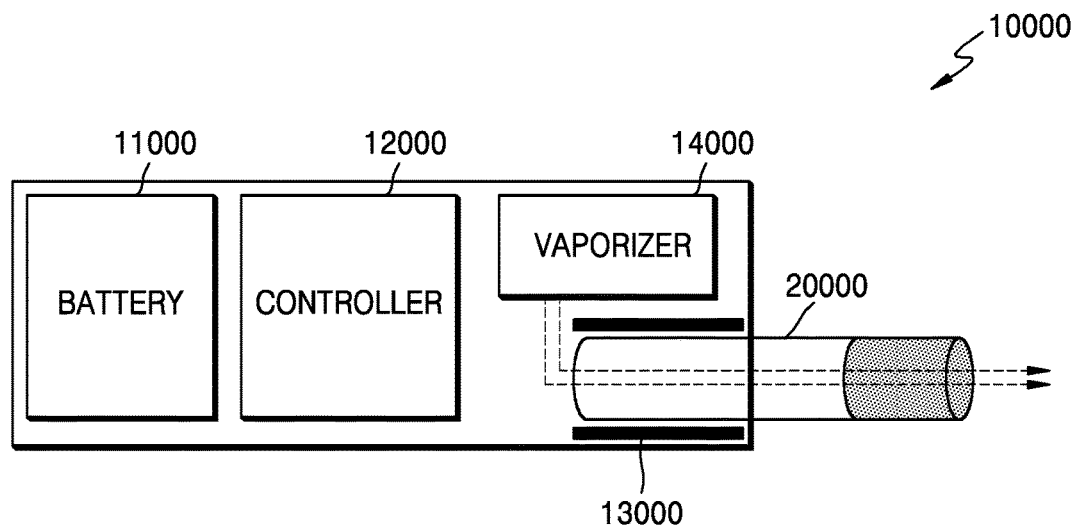

FIGS. 1 and 2 are diagrams showing examples in which a cigarette is inserted into an aerosol generating device.

Referring to FIGS. 1 and 2, an aerosol generating device 10000 includes a battery 11000, a controller 12000, a heater 13000, and a vaporizer 14000. Also, a cigarette 20000 may be inserted into an inner space of the aerosol generating device 10000.

FIGS. 1 and 2 only illustrate some components of the aerosol generating device 10000, which are related to the present exemplary embodiment. Therefore, it will be understood by one of ordinary skill in the art related to the present exemplary embodiment that other general-purpose components may be further included in the aerosol generating device 10000, in addition to the components illustrated in FIG. 1.

Also, FIGS. 1 and 2 illustrate that the aerosol generating device 10000 includes the heater 13000. However, as necessary, the heater 13000 may be omitted.

FIG. 1 illustrates that the battery 11000, the controller 12000, the vaporizer 14000, and the heater 13000 are arranged in series. On the other hand, FIG. 2 illustrates that the vaporizer 14000 and the heater 13000 are arranged in parallel. However, the internal structure of the aerosol generating device 10000 is not limited to the structures illustrated in FIG. 1 or FIG. 2. In other words, according to the design of the aerosol generating device 10000, the battery 11000, the controller 12000, the vaporizer 14000, and the heater 13000 may be differently arranged.

When the cigarette 20000 is inserted into the aerosol generating device 10000, the aerosol generating device 10000 may operate the vaporizer 14000 to generate aerosol. The aerosol generated by the vaporizer 14000 is delivered to the user by passing through the cigarette 20000. The vaporizer 14000 will be described in more detail later.

The battery 11000 may supply power to be used for the aerosol generating device 10000 to operate. For example, the battery 11000 may supply power to heat the heater 13000 or the vaporizer 14000 and may supply power for operating the controller 12000. Also, the battery 11000 may supply power for operations of a display, a sensor, a motor, etc. mounted in the aerosol generating device 10000.

The controller 12000 may generally control operations of the aerosol generating device 10000. In detail, the controller 12000 may control not only operations of the battery 11000, the heater 13000, and the vaporizer 14000, but also operations of other components included in the aerosol generating device 10000. Also, the controller 12000 may check a state of each of the components of the aerosol generating device 10000 to determine whether or not the aerosol generating device 10000 is in an operable state.

The controller 12000 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The heater 13000 may be heated by the power supplied from the battery 11000. For example, when the cigarette 20000 is inserted into the aerosol generating device 10000, the heater 13000 may be located outside the cigarette 20000 and increase a temperature of an aerosol generating material in the cigarette 20000.

The heater 13000 may include an electro-resistive heater. For example, the heater 13000 may include an electrically conductive track, and the heater 13000 may be heated when currents flow through the electrically conductive track. However, the heater 13000 is not limited to the example described above and may include any other heaters which may be heated to a desired temperature. Here, the desired temperature may be pre-set in the aerosol generating device 10000 or may be set by a user.

Also, the aerosol generating device 10000 may include a plurality of heaters 13000. Here, the plurality of heaters 13000 may be arranged outside the cigarette 20000. In addition, the shape of the heater 13000 is not limited to the shapes illustrated in FIGS. 1 and 2 and may include various shapes.

The vaporizer 14000 may generate aerosol by heating a liquid composition and the generated aerosol may pass through the cigarette 20000 to be delivered to a user. In other words, the aerosol generated by the vaporizer 14000 may move along an air flow passage of the aerosol generating device 10000. The air flow passage may be configured such that the aerosol generated by the vaporizer 14000 passes through the cigarette 20000 to be delivered to the user.

For example, the vaporizer 14000 may include a liquid storage, a liquid delivery element, and a heating element, but it is not limited thereto. For example, the liquid storage, the liquid delivery element, and the heating element may be included in the aerosol generating device 10000 as independent modules.

The liquid storage may store a liquid composition. For example, the liquid composition may be a liquid including a tobacco-containing material having a volatile tobacco flavor component, or a liquid including a non-tobacco material. The liquid storage may be formed to be detachable from the vaporizer 14000 or may be formed integrally with the vaporizer 14000.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be wound around the liquid delivery element. The heating element may be heated by electrical current and may transfer heat to the liquid composition in contact with the heating element, thereby heating the liquid composition. As a result, aerosol may be generated.

For example, the vaporizer 14000 may be referred to as a cartomizer or an atomizer, but it is not limited thereto.

The aerosol generating device 10000 may further include general-purpose components in addition to the battery 11000, the controller 12000, and the heater 13000. For example, the aerosol generating device 10000 may include a display capable of outputting visual information and/or a motor for outputting haptic information. Also, the aerosol generating device 10000 may include at least one sensor (a puff detecting sensor, a temperature detecting sensor, a cigarette insertion detecting sensor, etc.). Also, the aerosol generating device 10000 may be formed as a structure where, even when the cigarette 20000 is inserted into the aerosol generating device 10000, external air may be introduced or internal air may be discharged.

Although not illustrated in FIGS. 1 and 2, a cradle may be used with the aerosol generating device 10000 to form a system. For example, the cradle may be used to charge the battery 11000 of the aerosol generating device 10000. Alternatively, the heater 13000 may be heated when the cradle and the aerosol generating device 10000 are coupled to each other.

The cigarette 20000 may be similar to a general combustive cigarette. For example, the cigarette 20000 may be divided into a first portion including an aerosol generating material and a second portion including a filter, etc. Alternatively, the second portion of the cigarette 20000 may also include an aerosol generating material. For example, an aerosol generating material made in the form of granules or capsules may be inserted into the second portion.

The entire first portion may be inserted into the aerosol generating device 10000, and the second portion may be exposed to the outside. Alternatively, only a portion of the first portion may be inserted into the aerosol generating device 10000. Otherwise, the entire first portion and a portion of the second portion may be inserted into the aerosol generating device 10000. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generating device 10000. For example, opening and closing of the air passage and/or a size of the air passage may be adjusted by the user. Accordingly, the amount of smoke and smoking satisfaction may be adjusted by the user. As another example, the external air may flow into the cigarette 20000 through at least one hole formed in a surface of the cigarette 20000.

Hereinafter, an example of the cigarette 20000 will be described with reference to FIG. 3.

Figure 3:
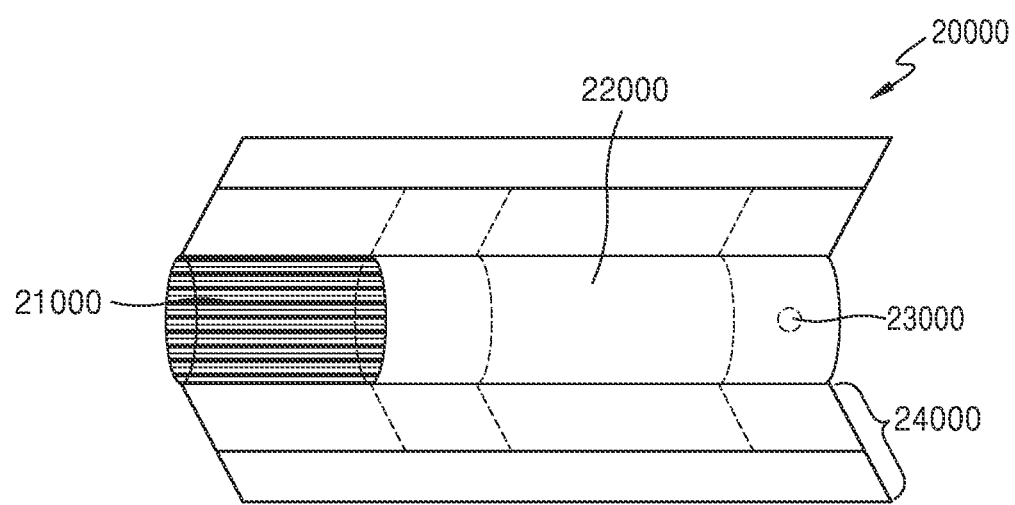
FIG. 3 is a drawing illustrating an example of a cigarette.

FIG. 3 is a drawing illustrating an example of a cigarette.

Referring to FIG. 3, the cigarette 20000 may include a tobacco rod 21000 and a filter rod 22000. The first portion described above with reference to FIGS. 1 and 2 may include the tobacco rod 21000, and the second portion may include the filter rod 22000.

FIG. 3 illustrates that the filter rod 22000 includes a single segment. However, the filter rod 22000 is not limited thereto. In other words, the filter rod 22000 may include a plurality of segments. For example, the filter rod 22000 may include a first segment configured to cool aerosol and a second segment configured to filter a certain component included in the aerosol. Also, as necessary, the filter rod 22000 may further include at least one segment configured to perform other functions.

The cigarette 20000 may be packaged using at least one wrapper 24000. The wrapper 24000 may have at least one hole through which external air may be introduced or internal air may be discharged. For example, the cigarette 20000 may be packaged using one wrapper 24000. As another example, the cigarette 20000 may be doubly packaged using at least two wrappers 24000. For example, the tobacco rod 21000 may be packaged using a first wrapper, and the filter rod 22000 may be packaged using a second wrapper. Also, the tobacco rod 21000 and the filter rod 22000, which are respectively packaged using separate wrappers, may be combined and packaged together using a third wrapper. When each of the tobacco rod 21000 and the filter rod 22000 includes a plurality of segments, each segment may be packaged using a separate wrapper. Also, the entire cigarette 20000 including the plurality of segments, which are respectively packaged using the separate wrappers and which are coupled to each other, may be re-packaged using another wrapper.

The tobacco rod 21000 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21000 may include other additives, such as flavors, a wetting agent, and/or organic acid. Also, the tobacco rod 21000 may include a flavored liquid, such as menthol or a moisturizer, which is injected to the tobacco rod 21000.

The tobacco rod 21000 may be manufactured in various forms. For example, the tobacco rod 21000 may be formed as a sheet or a strand. Also, the tobacco rod 21000 may be formed as a pipe tobacco, which is formed of tiny bits cut from a tobacco sheet. Also, the tobacco rod 21000 may be surrounded by a heat conductive material. For example, the heat conductive material may be, but is not limited to, a metal foil such as aluminum foil. For example, the heat conductive material surrounding the tobacco rod 21000 may uniformly distribute heat transmitted to the tobacco rod 21000, and thus, the heat conductivity applied to the tobacco rod may be increased and taste of the tobacco may be improved.

The filter rod 22000 may include a cellulose acetate filter. Shapes of the filter rod 22000 are not limited. For example, the filter rod 22000 may include a cylinder-type rod or a tube-type rod having a hollow inside. Also, the filter rod 22000 may include a recess-type rod. When the filter rod 22000 includes a plurality of segments, at least one of the plurality of segments may have a different shape.

The filter rod 22000 may be formed to generate flavors. For example, a flavoring liquid may be injected onto the filter rod 22000, or an additional fiber coated with a flavoring liquid may be inserted into the filter rod 22000.

Also, the filter rod 22000 may include at least one capsule 23000. Here, the capsule 23000 may generate a flavor or aerosol. For example, the capsule 23000 may have a configuration in which a liquid containing a flavoring material is wrapped with a film. For example, the capsule 23000 may have a spherical or cylindrical shape, but is not limited thereto.

When the filter rod 22000 includes a segment configured to cool the aerosol, the cooling segment may include a polymer material or a biodegradable polymer material. For example, the cooling segment may include pure polylactic acid alone, but the material for forming the cooling segment is not limited thereto. In some exemplary embodiments, the cooling segment may include a cellulose acetate filter having a plurality of holes. However, the cooling segment is not limited to the above-described example and any other cooling segment that is capable of cooling the aerosol may be used.

Although not illustrated in FIG. 3, the cigarette 20000 according to an exemplary embodiment may further include a front-end filter. The front-end filter may be located on a side of the tobacco rod 21000, which is the side not facing the filter rod 22000. The front-end filter may prevent the tobacco rod 21000 from being detached outwards and prevent a liquefied aerosol from flowing into the aerosol generating device 10000 (FIGS. 1 and 2) from the tobacco rod 21000, during smoking.

Figure 4:
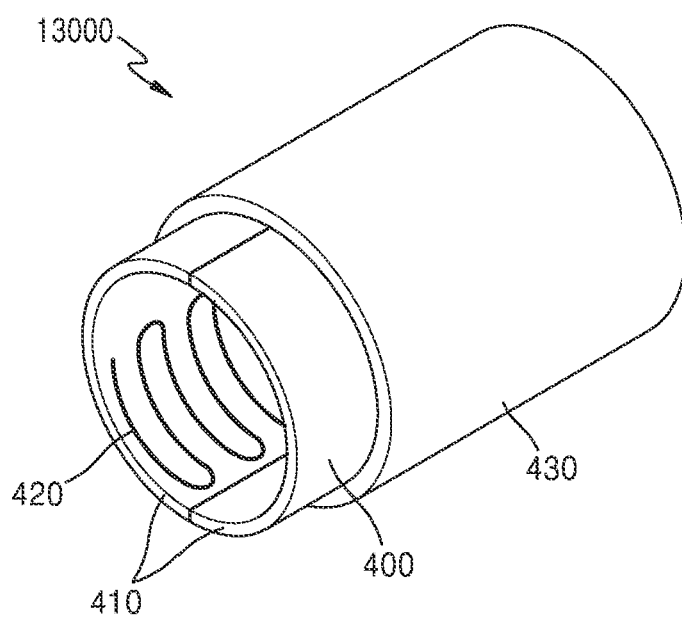
FIG. 4 is a diagram illustrating an example of a heater for an aerosol generation device according to some exemplary embodiments.

FIG. 4 is a diagram illustrating an example of a heater for an aerosol generation device according to some exemplary embodiments.

Referring to FIG. 4, a heater 13000 for the aerosol generation device may include a plurality of segments 410, one or more electrically conductive tracks 420, and an elastic member 430. Meanwhile, only some elements related to the present exemplary embodiment are illustrated in the heater 13000 for the aerosol generation device illustrated in FIG. 4. Accordingly, it will be understood by those skilled in the art that the general purpose elements other than the elements shown in FIG. 4 may be further included in the heater 13000 for the aerosol generation device. For example, the heater 13000 may include at least one electrical connector (not shown) for electrical connection between the electrically conductive track 420 and a battery 11000.

The plurality of segments 410 may refer to a structure that the plurality of segments 410 are coupled to each other to form an insertion portion into which an object-to-be-heated is inserted. For example, each of the plurality of segments 410 may have a shape that is obtained by cutting a cylindrical structure into a plurality of parts. When the plurality of segments 410 are coupled to each other to form the cylindrical structure, an accommodation space, that is, the insertion portion, for accommodating the object-to-be-heated (e.g., a cigarette 20000) may be formed.

As shown in FIG. 4, the cross-sectional shape of the insertion portion 400 formed by the structure in which the plurality of segments 410 are combined may be a circle that corresponds to a shape of the cigarette 20000. However, the present disclosure is not limited thereto, and the cross-sectional shape of the insertion portion 400 formed by the combined segments 410 may be a polygon or may have various sizes and shapes according to the shape of the cigarette 20000.

In addition, the plurality of segments 410 may include a heat resistant material to withstand heat generated from the electrically conductive track 420, may include a heat insulating material to prevent the heat generated from the electrically conductive track 420 from being lost to the outside, and may have a thermal conductivity to evenly heat the object-to-be-heated inserted therein.

The plurality of segments 410 may include a rigid material to accommodate the cigarette 20000 therein and maintain its shape. For example, the plurality of segments 410 may be a ceramic material or an electrically insulating material such as a heat resistant polymer material.

However, the present disclosure is not limited thereto, and the plurality of segments 410 may include any suitable metal material such as copper, nickel, iron, chromium, or an alloy thereof. When the plurality of segments 410 include the metal material, a separate electrical insulation layer 415 (see FIG. 6B) capable of preventing the conduction of electricity may be further included between the plurality of segments 410 and the electrically conductive track 420. The electrically insulating layer may be a heat resistant polymer material that may withstand the heat generated from the electrically conductive track 420 and have insulation, but is not limited thereto.

The electrically conductive track 420 may refer to an electrically resistive heating element that is supplied with power from the battery 11000 and generates heat as current flows. The electrically conductive track 420 may be printed on one surface of each of the plurality of segments 410 and disposed towards the cigarette 20000. For example, the electrically conductive tracks 420 printed on one surface of each of the plurality of segments 410 may be disposed to face each other. Accordingly, the cigarette 20000 inserted into the insertion portion 400 formed by coupling the plurality of segments 410 to each other may be adjacent to the electrically conductive track 420.

According to the structure of the heater 13000 for the aerosol generation device according to the present disclosure, the electrically conductive track 420 may be easily printed on one surface of each of the plurality of segments 410 having the shape obtained by cutting the cylindrical structure into the plurality of parts, that is, on the inner surface of the cylindrical structure. Because the electrically conductive track 420 is printed on the inner surface of the heater 13000, the electrically conductive track 420 and the cigarette 20000 may be in direct contact, and the heat transfer efficiency with respect to the cigarette 20000 may increase.

Meanwhile, the electrically conductive track 420 may be printed on a position corresponding to a tobacco rod 21000 of the cigarette 20000 inserted into the insertion portion 400. Accordingly, an aerosol generation material included in the tobacco rod 21000 of the cigarette 20000 may be effectively heated. However, the present disclosure is not limited thereto, and the electrically conductive track 420 may be printed on any suitable position of one surface of the plurality of segments 410 constituting the heater 13000. Hereinafter, examples of the plurality of segments 410 having the electrically conductive tracks 420 printed on the respective inner surfaces thereof will be described in detail with reference to FIGS. 5A to 5C.

Figure 5A:
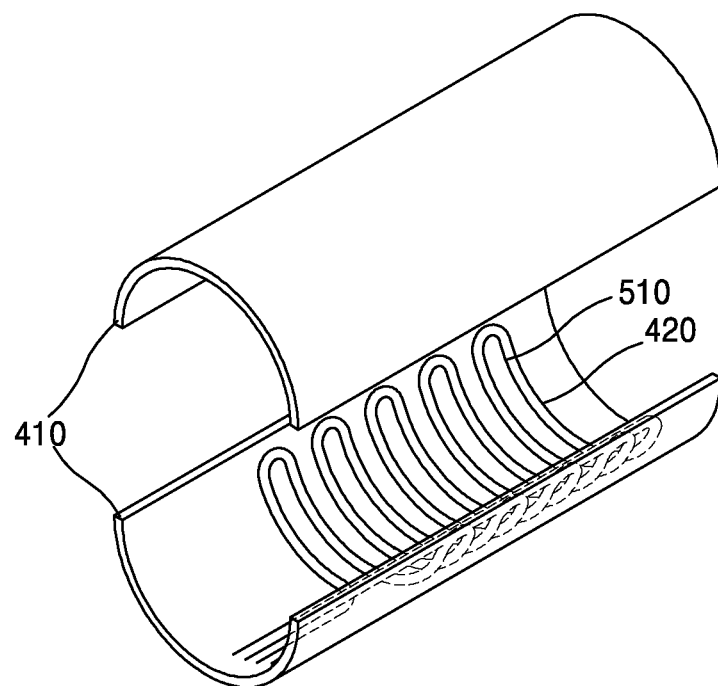
FIG. 5A is a diagram illustrating an example of a plurality of segments in which electrically conductive tracks are printed on the respective inner surfaces thereof, according to some exemplary embodiments.
Figure 5B:
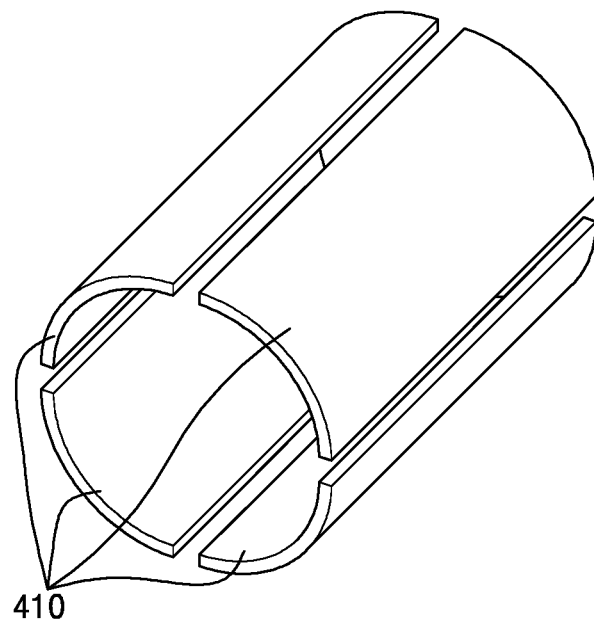
FIG. 5B is a diagram illustrating another example of a plurality of segments according to some exemplary embodiments.
Figure 5C:
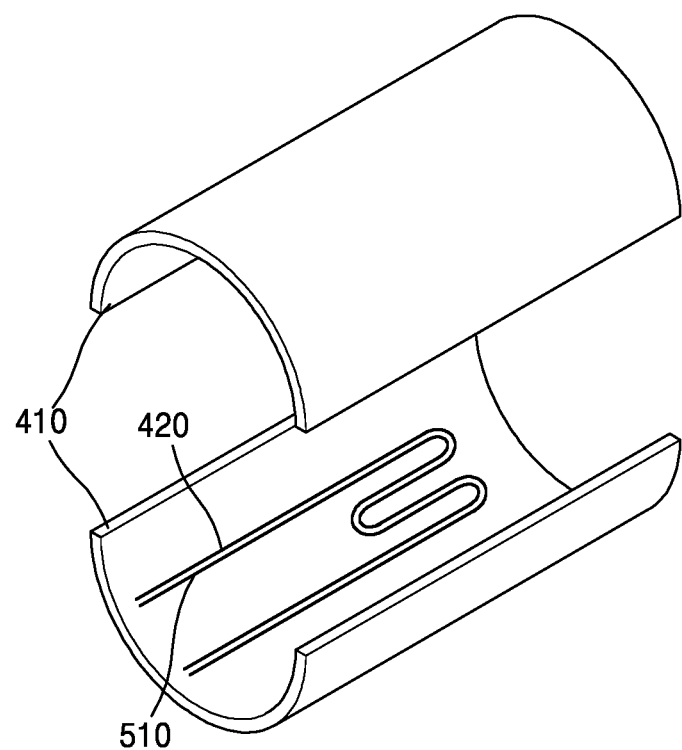
FIG. 5C is a diagram illustrating another example of a plurality of segments according to some exemplary embodiments.

FIG. 5A is a diagram illustrating an example of a plurality of segments in which electrically conductive tracks are printed on the respective inner surfaces thereof according to an exemplary embodiment. FIG. 5B is a diagram illustrating another example of a plurality of segments according to an exemplary embodiment. FIG. 5C is a diagram illustrating another example of a plurality of segments according to an exemplary embodiment.

As shown in FIG. 5A, the plurality of segments 410 may have a shape in which a member of a cylindrical structure is cut into two parts. For example, the cross-sectional shape of each of the plurality of segments 410 may be a semicircle. Because each of the plurality of segments 410 are formed by cutting the member of the cylindrical structure into two parts, the electrically conductive track 420 may be more easily printed on the inner surface of each of the plurality of segments 410 as compared with a cylindrical structure.

As shown in FIG. 5B, the plurality of segments 410 may have a shape obtained by cutting a cylindrical structure into four parts. For example, the cross-sectional shape of each of the plurality of segments 410 may be a quadrant. However, the present disclosure is not limited thereto, and the plurality of segments 410 may have a shape obtained by cutting the cylindrical structure into any suitable number of parts. In addition, the plurality of segments 410 may be formed by cutting a structure of a non-cylindrical shape into a plurality of parts.

The electrically conductive track 420 may be printed in a horizontal pattern as shown in FIG. 5A, or may be printed in a vertical pattern as shown in FIG. 5C. However, the present disclosure is not limited to the above examples, and the pattern or shape of the electrically conductive track 420 may be variously implemented in an angular shape, a curved shape, a mesh shape, an atypical shape, etc.

Referring back to FIG. 4, the plurality of segments 410 may be heated to different temperatures by the one or more electrically conductive tracks 420. The separate electrically conductive track 420 is printed on each of the plurality of segments 410, and thus the plurality of segments 410 may be heated to different temperatures by a controller 12000 that controls power supply to the one or more electrically conductive tracks 420. For example, one of the plurality of segments 410 located close to an external housing of the aerosol generation device 10000 may be heated to a low temperature, and one of the plurality of segments 410 located far from the external housing of the aerosol generation device 10000 may be heated to a high temperature. However, the present disclosure is not limited thereto, and the plurality of segments 410 may be heated to the same temperature.

Meanwhile, the heater 13000 may further include one or more sensor tracks 510 printed on one surface of each of the plurality of segments 410. The sensor track 510 may be printed in a similar manner as the electrically conductive track 420, as shown in FIGS. 5A and 5C. Because the sensor track 510 is printed on one surface of each of the plurality of segments 410, the temperature of each of the plurality of segments 410 may be independently detectable. Similar to the electrically conductive track 420, the sensor track 510 may include an electrically resistive element or an electrically conductive element. For example, the sensor track 510 may include tungsten, gold, platinum, silver, copper, nickel, palladium, or a combination thereof and may be doped with a suitable dopant or include an alloy. However, the present disclosure is not limited thereto.

In addition, the heater 13000 may further include a coating layer 415 (see FIG. 6B) formed on one surface of each of the plurality of segments 410 to protect the electrically conductive track 420 or the sensor track 510. The coating layer 415 may include a heat resistant composition having a property of electrical insulation. For example, the coating layer 415 may include one of a single coating layer of a glass film coating layer, a Teflon coating layer, and a Thermolon coating layer. In addition, the coating layer 415 may include a composite coating layer composed of a combination of two or more layers of the glass film coating layer, the Teflon coating layer and the Thermolon coating layer. However, the present disclosure is not limited thereto. The coating layer 415 may include any suitable material for protecting the electrically conductive track 420 or the sensor track 510. In addition, the coating layer 415 may be formed on one surface of each of the plurality of segments 410 using any suitable method including deposition, spraying, lamination, etc.

The elastic member 430 may have elasticity and surround at least some of the plurality of segments 410. The elastic member 430 may surround and compress at least a part of the plurality of segments 410 to maintain the coupling of the plurality of segments 410. For example, the elastic member 430 may include a material having elastic force in an inner surface direction of the elastic member 430, that is, in a direction for pressing an object-to-be-heated inserted into an insertion portion 400 formed by the plurality of segments 410. The inner diameter of the elastic member 430 may be smaller than the outer diameter of a structure in which the plurality of segments 410 are closely combined along the outer circumference of the cigarette 20000.

Therefore, when the elastic member 430 surrounds the combined segments 410, the elastic member 430 stretches from its original state, and in this case, the elastic member 430 may apply the elastic force to the plurality of segments 410 so as to return to the original state. The structure in which the plurality of segments 410 are combined may be maintained by the elastic force of the elastic member 430 surrounding the plurality of segments 410. The insert portion into which the cigarette 20000 is inserted may be formed by maintaining the coupling of the segments 410.

Meanwhile, the inner diameter of the structure in which the plurality of segments 410 are combined may be smaller than the outer diameter of the cigarette 20000. Therefore, by the cigarette 20000 inserted into the insertion portion 400, at least some of the plurality of segments 410 may be spaced apart from each other, and the elastic member 430 may apply the elastic force in a direction that keeps the plurality of segments 410 close. The electrically conductive track 420 printed on one surface of each of the plurality of segments 410 may be in close contact with the cigarette 20000 by the elastic force applied by the elastic member 430 to the plurality of segments 410. Because the electrically conductive track 420 and the cigarette 20000 are in close contact with each other, the heat transfer efficiency with respect to the cigarette 20000 may further increase.

Figure 6A:
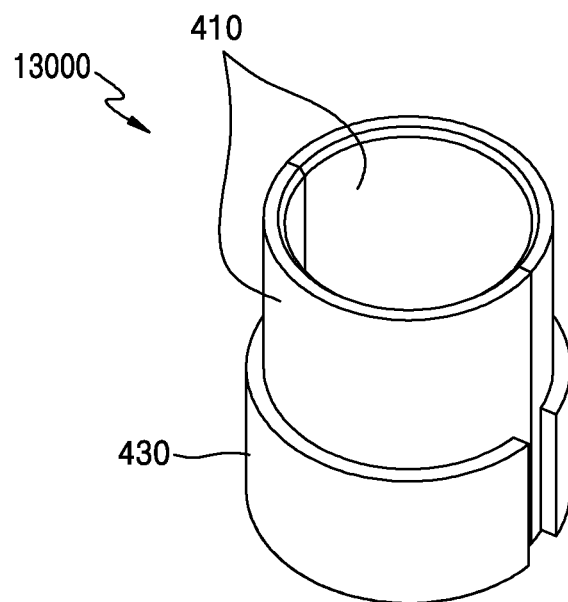
FIG. 6A is a diagram illustrating another example of a heater for an aerosol generation device according to some exemplary embodiments.

FIG. 6A is a diagram illustrating another example of a heater for an aerosol generation device according to an exemplary embodiment.

Referring to FIG. 6A, the heater 13000 for the aerosol generation device may have the same configuration as that of FIG. 4, except for a slight difference in the shape or material of the elastic member 430. For example, although the electrically conductive track 420 is omitted in FIG. 6A, the heater 13000 may include the electrically conductive track 420 printed on one surface of each of the plurality of segments 410. Descriptions of the plurality of segments 410, the electrically conductive track 420, and the elastic member 430 have been provided above with reference to FIG. 4 and thus are omitted herein.

As shown in FIG. 6A, the elastic member 430 may not have a perfect circular cross-sectional shape, but may have a ring-shaped cross-sectional shape. In this case, the elastic member 430 may include a material having a relatively smaller elastic force and relatively more rigid compared to FIG. 4. However, it is the same that the elastic member 430 serves to maintain a structure of the combined segments 410 by surrounding and compressing at least a part of the plurality of segments 410. Hereinafter, the function of the elastic member 430 will be described in more detail with reference to FIG. 6B.

Figure 6B:
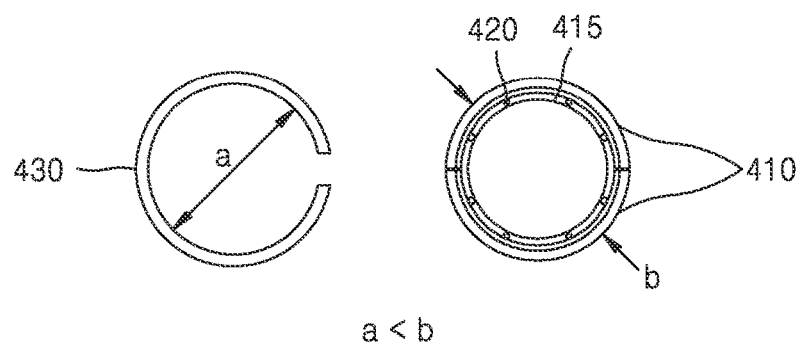
FIG. 6B is a cross-sectional view of a structure in which an elastic member and a plurality of segments are coupled, viewed from a direction in which a cigarette is inserted, according to some exemplary embodiments.

FIG. 6B is a cross-sectional view of a structure in which an elastic member and a plurality of segments are coupled viewed from a direction in which a cigarette is inserted according to some exemplary embodiments.

Referring to FIG. 6B, an inner diameter a of the elastic member 430 is smaller than an outer diameter b of a structure in which the plurality of segments 410 are closely combined. Accordingly, when the elastic member 430 surrounds the structure in which the plurality of segments 410 are combined, the elastic member 430 stretches from its original state, and in this case, the elastic member 430 may apply elastic force to the plurality of segments 410 so as to return to the original state. The structure in which the plurality of segments 410 are combined may be maintained by the elastic force of the elastic member 430 surrounding at least a part of the plurality of segments 410. The insert portion into which the cigarette 20000 is inserted may be formed by maintaining the structure in which the plurality of segments 410 are combined.

Figure 7:
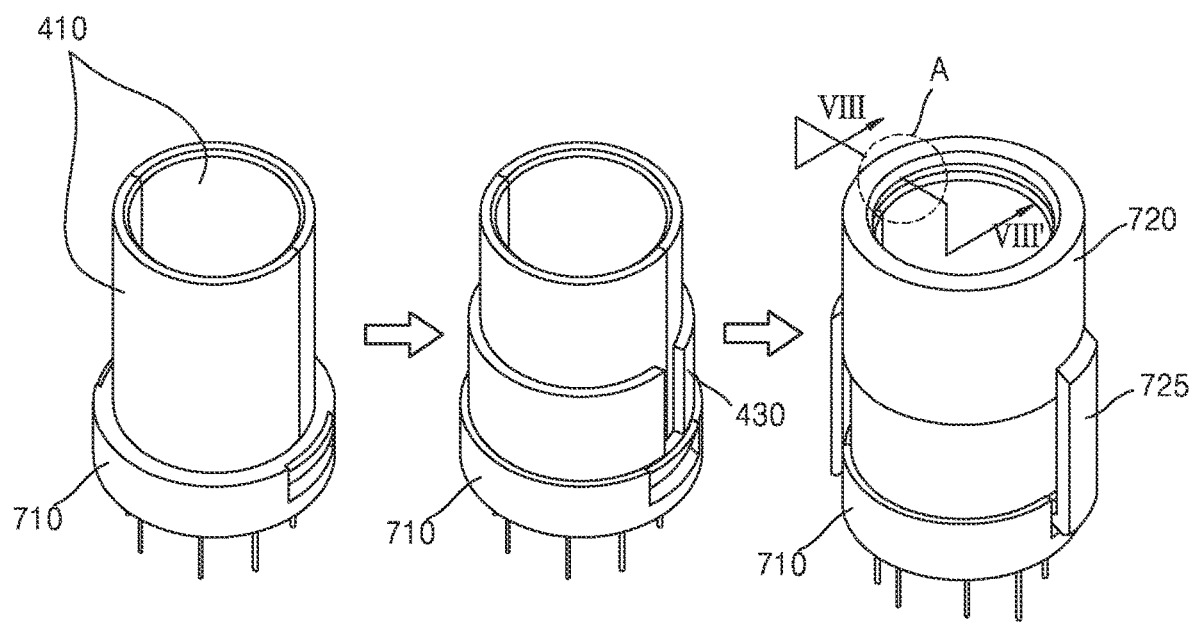
FIG. 7 is a diagram illustrating another example of a heater for an aerosol generation device according to some exemplary embodiments.

FIG. 7 is a diagram illustrating another example of a heater for an aerosol generation device according to some exemplary embodiments.

Referring to FIG. 7, the heater 13000 may further include a lower support portion 710 and an upper support portion 720 in addition to the plurality of segments 410, the electrically conductive track 420, and the elastic member 430.

The lower support portion 710 may refer to a support structure disposed at a lower end of the plurality of segments 410 to support the plurality of segments 410 at the lower end. The upper support portion 720 may refer to a support structure disposed at an upper end of the plurality of segments 410 to support the plurality of segments 410 at the upper end. The upper support portion 720 may include one or more wing portion 725 bound to the lower support portion 710. However, the present disclosure is not limited thereto, and the lower support portion 710 may include one or more wing portion (not shown) bound to the upper support portion 720. Meanwhile, because the wing portion 725 of the upper support portion 720 is bound to the lower support portion 710, the vertical movement of the plurality of segments 410 may be prevented, and the heater 13000 may have a more stable structure. Hereinafter, the function of the upper support portion 720 will be described in more detail with reference to FIG. 8.

Figure 8:
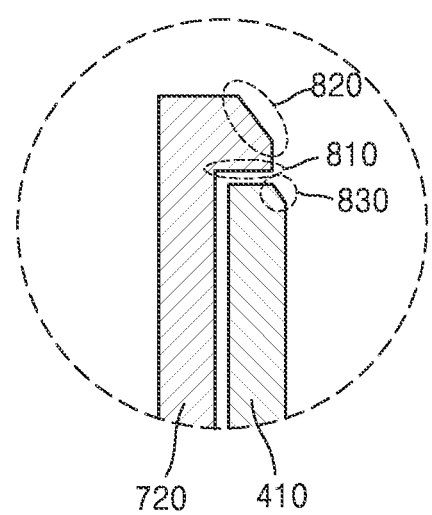
FIG. 8 is a cross-sectional view of portion A of FIG. 7 taken along the line VIII-VIII'.

FIG. 8 is a cross-sectional view of a portion A of FIG. 7 taken along the line VIII-VIII'.

Referring to FIG. 8, the upper support portion 720 may include a protrusion portion 810 protruding inward from an upper end thereof. An upward movement of the plurality of segments 410 may be prevented by the protrusion portion 810 of the upper support portion 720. For example, the protrusion portion 810 may include a catch structure for preventing the upward movement of the plurality of segments 410. However, the present disclosure is not limited thereto, and the protrusion portion 810 may include any suitable structure for preventing the upward movement of the plurality of segments 410.

Meanwhile, an edge portion 820 of the upper support portion 720 and an edge portion 830 of the plurality of segments 410 may have a tapered shape as illustrated in FIG. 8. Therefore, as described above, even if the inner diameter of a structure in which the plurality of segments 410 are combined is smaller than the outer diameter of the cigarette 20000, the cigarette 20000 may be easily inserted into the insertion portion formed by the structure in which the plurality of segments 410 are combined. However, the present disclosure is not limited thereto, and the edge portion 820 of the upper support portion 720 and the edge portion 830 of the plurality of segments 410 may have a round shape or any suitable shape that allows the cigarette 20000 to be easily inserted.

Returning to FIG. 7, the inner surface of at least one of the lower support portion 710, the elastic member 430, and the upper support portion 720 may include one or more portions spaced apart from the outer surface of the plurality of segments 410. Accordingly, one or more air gaps 411 (see FIG. 9B) may be formed between the outer surface of the plurality of segments 410 and the inner surface of at least one of the lower support portion 710, the elastic member 430, and the upper support portion 720. Because the thermal conductivity of gases is smaller than that of solids, the transfer of heat generated from the electrically conductive track 420 to the outside of the heater 13000 may be minimized by the one or more air gaps 411. Accordingly, the loss of heat generated from the electrically conductive track 420 may be minimized and the heat transfer efficiency with respect to the cigarette 20000 may increase.

In addition, the inner surface of at least one of the lower support portion 710, the elastic member 430, and the upper support portion 720 may contact the outer surface of the plurality of segments 410 along a line (i.e., by a line contact) or at a point (i.e., by a point contact). Because the thermal conductivity is more reduced when contacting by the line contact or the point contact than when contacting by a surface contact, the transfer of the heat generated from the electrically conductive track 420 to at least one of the lower support portion 710, the elastic member 430, and the upper support portion 720 through the plurality of segments 410 may be minimized. Minimizing the transfer of the heat to at least one of the lower support portion 710, the elastic member 430, and the upper support portion 720 means minimizing of the transfer of the heat to the outside of the heater 13000. Hereinafter, a process of minimizing the transfer of the heat generated from the electrically conductive track 420 to the outside of the heater 13000 will be described in more detail with reference to FIGS. 9A and 9B.

Figure 9A:
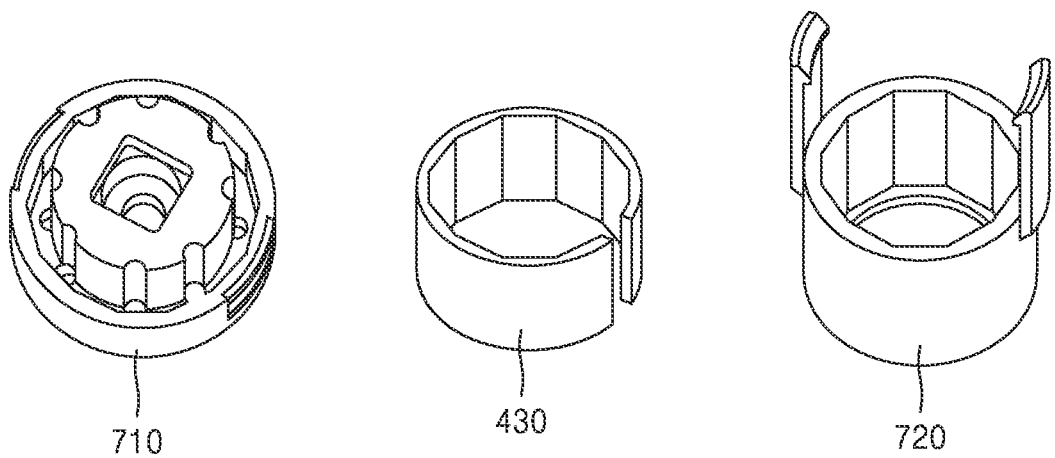
FIG. 9A illustrates an example of a lower support portion, an elastic member, and an upper support portion according to some exemplary embodiments.
Figure 9B:
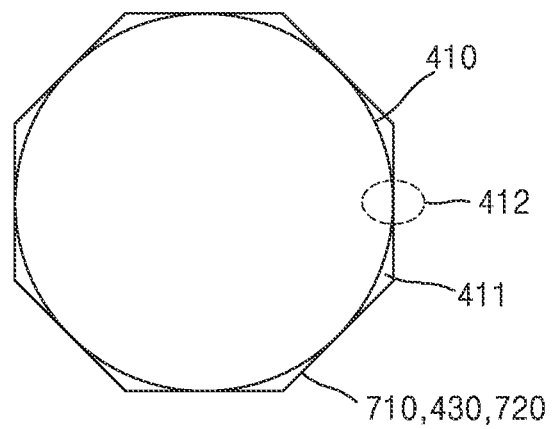
FIG. 9B illustrates a method of contact between any one of the lower support portion, the elastic member, and the upper support portion and a structure in which a plurality of segments are coupled, according to some exemplary embodiments.

FIG. 9A illustrates an example of a lower support portion, an elastic member, and an upper support portion according to an exemplary embodiment, and FIG. 9B illustrates a contact method between the combined segments and one of the lower support portion, the elastic member, and the upper support portion, according to an exemplary embodiment.

Referring to FIG. 9A, a cross-sectional shape of the lower support portion 710, the elastic member 430, and the upper support portion 720, which surround at least a part of the plurality of segments 410, is not a circle but is a polygon, when viewed in a direction in which the cigarette 20000 is inserted. Because the plurality of segments 410 are coupled to each other to form a cylindrical structure, at least one of the lower support portion 710, the elastic member 430, and the upper support portion 720 may be in contact with the combined segments 410 as shown in FIG. 9B.

Referring to FIG. 9B, at least one of the lower support portion 710, the elastic member 430, and the upper support portion 720 may be in contact with the plurality of segments 410 by a line contact 412 (i.e., contacting along a line) rather than a surface contact (i.e., contacting surface to surface), and one or more air gaps 411 may be formed between the combined segments 410 and at least one of the lower support portion 710, the elastic member 430, and the upper support portion 720. As described above, the transfer of heat generated from the electrically conductive track 420 to the outside of the heater 13000 may be minimized by the line contact 412 or the one or more air gaps 411.

However, as described with reference to FIGS. 9A and 9B, the cross-sectional shape of the lower support portion 710, the elastic member 430, and the upper support portion 720 may not be a polygon. Instead, an air gap 411 may be formed by one or more grooves formed in the inner surface of at least one of the lower support portion 710, the elastic member 430, and the upper support portion 720 Also, at least one of the lower support portion 710, the elastic member 430, and the upper support portion 720 may include a porous material. The lower support portion 710, the elastic member 430, and the upper support portion 720 may include any suitable structure for minimizing the transfer of the heat generated from the electrically conductive track 420 to the outside of the heater 13000.

Figure 10:
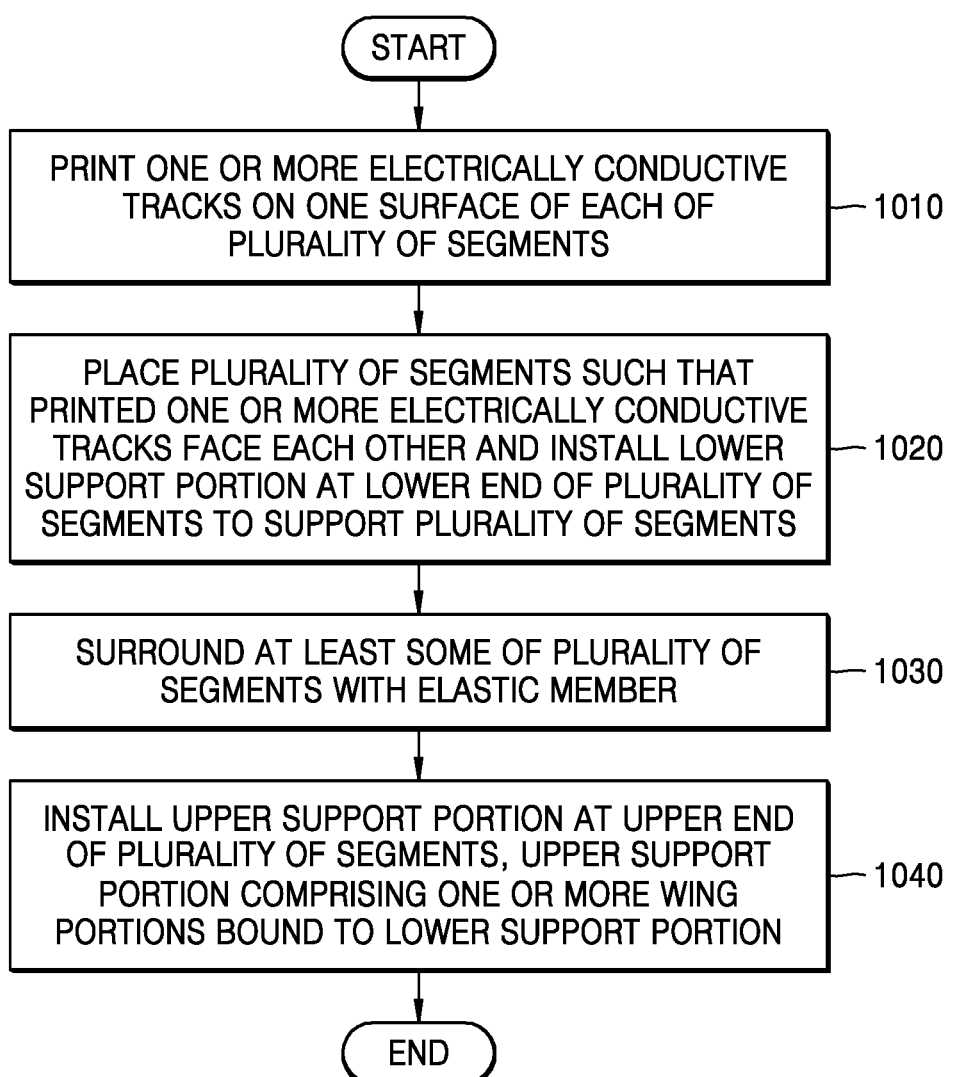
FIG. 10 is a flowchart illustrating a method of manufacturing a heater for an aerosol generation device according to some exemplary embodiments.

FIG. 10 is a flowchart illustrating a method of manufacturing a heater for an aerosol generation device according to an exemplary embodiment.

The method of manufacturing the heater for the aerosol generation device of FIG. 10 may be performed by a device for manufacturing the heater for the aerosol generation device (hereinafter referred to as a 'heater manufacturing device'). Those skilled in the art will appreciate that the heater manufacturing device may be any device commonly used in the art to manufacture heaters. The heater manufactured by the heater manufacturing device may be the same as the heater 13000 described with reference to FIGS. 4 to 9B. Therefore, the redundant descriptions are omitted.

In operation 1010, the heater manufacturing device may print one or more electrically conductive tracks on one surface of each of a plurality of segments. The heater manufacturing device prints the electrically conductive track on one surface of each of the plurality of segments having a shape obtained by cutting a cylindrical structure into a plurality of parts, that is, an inner surface of the cylindrical structure, and thus the electrically conductive track may be more easily printed compared with the case of the intact cylindrical structure.

In operation 1020, the heater manufacturing device may place the plurality of segments such that the printed one or more electrically conductive tracks face each other, and install a lower support portion at a lower end of the plurality of segments to support the plurality of segments. Assuming that the number of the plurality of segments is two, the heater manufacturing device may place a first segment and a second segment such that one or more electrically conductive tracks printed on one surface of the first segment and one or more electrically conductive tracks printed on one surface of the second segment face each other. Accordingly, an object-to-be-heated inserted into an insertion portion formed by the combined first and second segments may be adjacent to the one or more electrically conductive tracks. Meanwhile, the lower support portion is installed at the lower end of the plurality of segments, thereby preventing a step between the plurality of segments from occurring in a process of surrounding the plurality of segments with an elastic member. However, the present disclosure is not limited thereto, and the heater manufacturing device may prevent the step between the plurality of segments from occurring by using a separate cigarette shape guide.

In operation 1030, the heater manufacturing device may surround at least some of the plurality of segments with the elastic member. The elastic member may surround and compress at least a part of the plurality of segments to maintain a structure in which the plurality of segments are combined. The elastic member may include any suitable material having elastic force in its inner surface direction.

In operation 1040, the heater manufacturing device may install an upper support portion having one or more wing portions bound to the lower support portion on an upper end of the plurality of segments. Because the upper support portion and the lower support portion are bound to each other using the wing portion, the vertical movement of the plurality of segments may be prevented, and the heater manufactured by the heater manufacturing device may have a more stable structure.

It will be understood by one of ordinary skill in the art that various changes in form and details may be made therein without departing from the spirit and scope of the invention as defined by the appended claims. Therefore, the disclosed methods should be considered from an illustrative point of view, not from a restrictive point of view. The scope of the present disclosure is defined by the appended claims rather than by the foregoing description, and all differences within the scope of equivalents thereof should be construed as being included in the present disclosure.

What is claimed is:

1. A heater for an aerosol generation device, the heater comprising:
    a plurality of segments combined together to form an insertion portion into which an object-to-be-heated is inserted;
    one or more electrically conductive tracks printed on one surface of each of the plurality of segments and disposed toward the object-to-be-heated; and
    an elastic member configured to surround at least a part of the plurality of segments.

2. The heater of claim 1, wherein the elastic member is configured to surround and compress the part of the plurality of segments to maintain a structure in which the plurality of segments are combined.

3. The heater of claim 1, wherein the elastic member comprises a material having an elastic force in a direction of an inner surface of the elastic member.

4. The heater of claim 1, wherein an inner diameter of the elastic member is smaller than an outer diameter of a structure in which the plurality of segments are in close contact with each other along an outer circumference of the object-to-be-heated.

5. The heater of claim 1, wherein at least some of the plurality of segments are spaced apart from each other by the object-to-be-heated inserted into the insertion portion.

6. The heater of claim 1, wherein a cross-sectional shape of the elastic member configured to surround the part of the plurality of segments, when viewed in a direction in which the object-to-be-heated is inserted, is at least one of a circle and a polygon.

7. The heater of claim 1, further comprising:
    a lower support portion disposed at a lower end of the plurality of segments to support the plurality of segments at the lower end thereof; and
    an upper support portion configured to support the plurality of segments at an upper end thereof, and comprising one or more wing portions bound to the lower support portion.

8. The heater of claim 7, wherein the lower support portion, the elastic member, and the upper support portion are arranged such that an air gap is formed between an outer surface of the plurality of segments and at least one of the lower support portion, the elastic member, and the upper support portion.

9. The heater of claim 7, wherein the at least one of the lower support portion, the elastic member, and the upper support portion is in contact with the plurality of segments along a line.

10. The heater of claim 1, wherein the object-to-be-heated is a cigarette, and
    wherein the one or more electrically conductive tracks are disposed at a position corresponding to a tobacco rod of the cigarette inserted into the insertion portion.

11. The heater of claim 1, wherein the plurality of segments are heated to different temperatures by the one or more electrically conductive tracks.

12. The heater of claim 1, further comprising:
    a coating layer formed on an inner surface of each of the plurality of segments and configured to protect the one or more electrically conductive tracks.

13. The heater of claim 1, further comprising:
    one or more sensor tracks printed on an inner surface of each of the plurality of segments.

14. The heater of claim 13, wherein a temperature of each of the plurality of segments is independently detectable by the one or more sensor tracks.

15. An aerosol generation device comprising:
    a heater comprising:
        a plurality of segments combined together to form an insertion portion into which an object-to-be-heated is inserted;
        one or more electrically conductive tracks printed on one surface of each of the plurality of segments and disposed toward the object-to-be-heated; and
        an elastic member configured to surround at least a part of the plurality of segments; and a controller configured to heat the plurality of segments to different temperatures by controlling power supply to the one or more electrically conductive tracks.

16. A method of manufacturing a heater for an aerosol generation device, the method comprising:
   printing one or more electrically conductive tracks on one surface of each of a plurality of segments;
   placing the plurality of segments such that the one or more electrically conductive tracks face each other;
   installing a lower support portion at a lower end of the plurality of segments to support the plurality of segments;
   surrounding at least some of the plurality of segments with an elastic member; and
   installing an upper support portion at an upper end of the plurality of segments, the upper support portion comprising one or more wing portions bound to the lower support portion.

\* \* \* \* \*